United States Patent [19]

Overweg et al.

[11] Patent Number: 4,893,083

[45] Date of Patent: Jan. 9, 1990

[54] MAGNETIC RESONANCE APPARATUS COMPRISING INTEGRATED GRADIENT R.F. COILS

[75] Inventors: Johannes A. Overweg; Wilhelmus R. M. Mens, both of Eindhoven, Netherlands

[73] Assignee: U.S. Philips Corporation, New York, N.Y.

[21] Appl. No.: 233,308

[22] Filed: Aug. 17, 1988

[30] Foreign Application Priority Data

Aug. 19, 1987 [NL] Netherlands ............ 8701949

[51] Int. Cl.[4] ............................................. G01R 33/20
[52] U.S. Cl. ..................... 324/318; 324/320; 335/296; 335/301
[58] Field of Search ............... 324/300, 307, 318, 319, 324/320, 322; 128/653; 335/296, 299, 301

[56] References Cited

U.S. PATENT DOCUMENTS

| 4,442,404 | 12/1981 | Bergmann | 324/309 |
| 4,639,672 | 1/1987 | Beaumont | 324/318 |
| 4,652,824 | 3/1987 | Oppelt | 324/318 |
| 4,670,716 | 6/1987 | Kunz | 324/320 |
| 4,740,751 | 4/1988 | Misic et al. | 324/318 |

*Primary Examiner*—Tom Noland
*Assistant Examiner*—Kevin D. O'Shea
*Attorney, Agent, or Firm*—Thomas A. Briody; Jack E. Haken; Jack D. Slobod

[57] ABSTRACT

In a magnetic resonance apparatus a gradient coil system and an r.f. coil are combined so as to form a magnetically, electrically and structurally integrated coil system with current conductors in substantially the same cylinder. Thus, a substantial saving is realized as regards the activation energy required for generating gradient fields as well as for generating r.f. fields and notably r.f. stray-fields are also reduced.

21 Claims, 1 Drawing Sheet

MAGNETIC RESONANCE APPARATUS COMPRISING INTEGRATED GRADIENT R.F. COILS

BACKGROUND OF THE INVENTION

1. Field of the Invention

The invention relates to a magnetic resonance apparatus, comprising a magnet system for generating a steady magnetic field, a magnet system for generating mutually perpendicular gradient fields, and an r.f. coil for generating a spatially uniform r.f. magnetic field.

2. Description of the Prior Art

A magnetic resonance apparatus of this kind is known from an article in Computertomography 1, 1981, pages 2–10.

In an apparatus of this kind use is preferably made of a superconducting magnet system for generating the steady magnetic field, notably for apparatus involving a comparatively strong magnetic field, for example stronger than 0.5 T. The problem of high energy consumption for generating the steady field is thus circumvented. Because of its comparatively short switching times, it is difficult to construct a gradient coil system from superconducting coils. Therefore, the gradient coil system in known apparatus is one of the components having the highest energy consumption. The energy stored in such a coil system increases as the fifth power of the coil dimension. The smaller the coil is, the more efficient it will operate. A large amount of stored energy is unattractive not only because of the energy costs, but notably also because it impedes the realization of short switching times and an increasing number of disturbing phenomena occurs as the amount of energy required increases.

Known coil systems, for generating a uniform r.f. transmitter field in a comparatively large measuring space also require a comparatively large amount of energy. Moreover, the homogeneity of an r.f. field to be generated is affected by the presence of the gradient coils; a customary r.f. shield necessitates the use of complex and expensive power supply equipment.

SUMMARY OF THE INVENTION

It is the object of the invention to provide a magnetic resonance apparatus in which the energy required for the gradient coil system and for the r.f. coil system is reduced and in which the homogeneity of notably the r.f. field in a measuring space is at least equivalent to the homogeneity in known apparatus.

To achieve this, a magnetic resonance apparatus of the kind set forth in accordance with the invention is characterized in that the gradient coil system and the r.f. coil are combined so as to form a magnetically and structurally integrated gradient/r.f. coil system.

Because current conductors of gradient coils can be positioned substantially in one and the same cylinder generated surface, a coil system can be realized which has a substantially smaller diameter and hence a substantially lower energy consumption, and adverse effects on the r.f. field by the r.f. shield and the gradient coils can be reduced.

To this end, in a preferred embodiment current conductors of gradient coils serve as a shield for an r.f. coil system, so that the field homogeneity of the r.f. field is improved as well as stray-fields of the r.f. coils are reduced.

In a further preferred embodiment, current conductors of r.f. coils are integrated in structural members of the gradient coil system, the current conductors not being situated at the same distance from an axis of rotation in all locations, if desired.

In another preferred embodiment, arc conductors of gradient coils which are situated further outwards are integrated with r.f. coils so that a larger diameter can be achieved for the coil system, so that the accessibility for a patient to be examined is improved. On the other hand, a central portion of the coil system may thus have a smaller diameter, thus reducing the energy required.

BRIEF DESCRIPTION OF THE DRAWING

Some preferred embodiments in accordance with the invention will be described in detail hereinafter with reference to the drawing. Therein.

DETAILED DESCRIPTION OF THE PREFERRED EMBODIMENTS

Figure 1:
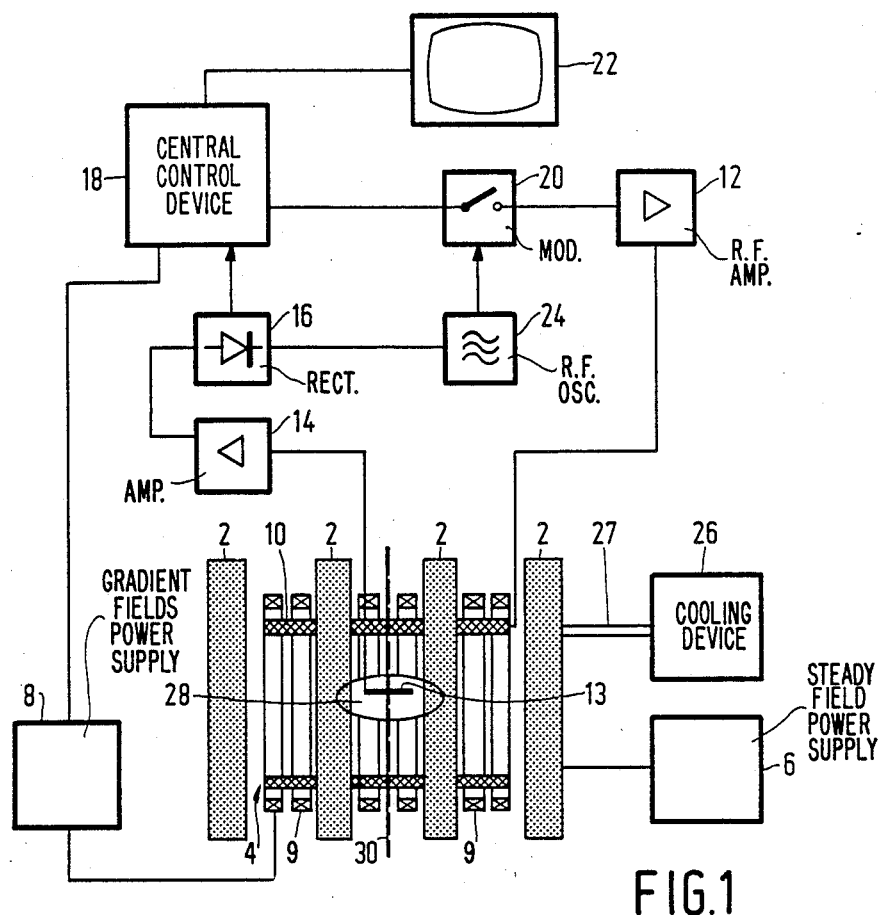
FIG. 1 shows a magnetic resonance apparatus in accordance with the invention.

A magnetic resonance apparatus as shown in FIG. 1 comprises a magnet system 2 for generating a steady, uniform magnetic field, an integrated magnet system 4, within magnet system 2, for generating magnetic gradient fields and r.f. magnetic alternating fields, and power supply sources 6 and 8 for the magnet system 2 and the gradient coils 9 of magnet system 4, respectively. An r.f. magnet coil 10 of the integrated magnet system 4 is connected to the output of an r.f. source amplifier 12 in order to generate an r.f. transmitter field. For the detection of magnetic resonance signals excited by the r.f. transmitter field in an object to be examined use can be made of, for example a surface coil 13. For detection, the coil 13 is connected to a signal amplifier 14. The signal amplifier 14 is connected to a phase-sensitive rectifier 16 which is connected to a central control device 18. The central control device 18 also controls a modulator 20 feeding the r.f. amplifier 12, the supply source 8 for the gradient coils, and a monitor 22 for display. An r.f. oscillator 24 controls the modulator 20 as well as the phase-sensitive rectifier 16 which processes the measuring signals. For cooling, if necessary, there is provided a cooling device 26 comprising cooling ducts 27. A cooling device of this kind can be constructed as a water cooling system for resistance coils or as a dewar system for superconducting coils. The transmitter coil 10 which is arranged to be the innermost part of the integrated magnet system 4, encloses a measuring space 28 which offers adequate room for accommodating patients in the case of an apparatus for medical diagnostic measurements. Thus, a steady magnetic field, gradient fields for position selection of slices to be imaged, and a spatially uniform r.f. alternating field can be generated in the measuring space 28.

The gradient coils 9 of integrated magnet system 4 are symmetrically arranged with respect to a radial symmetry plane 30 in a customary manner, which symmetry plane thus also subdivides the measuring space symmetrically into two halves and is directed through a point $Z=0$ transversely of a Z-axis. The steady magnetic field generated by the steady magnet system is directed along the Z-axis in the present embodiment. A gradient magnet system in a magnetic resonance apparatus customarily comprises, for each of the coordinate directions, a coil system which can be activated in order to generate fields with gradients in each of the directions, enabling point-wise imaging of an object.

Figure 2A:
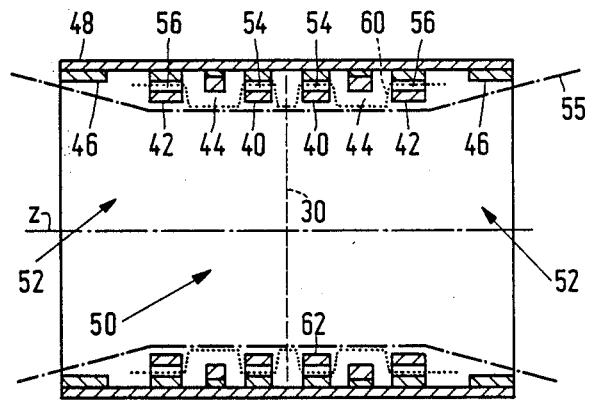
FIGS. 2a and 2b diagrammatically show an axial and a radial cross-section of an integrated gradient r.f. coil system.
Figure 2B:
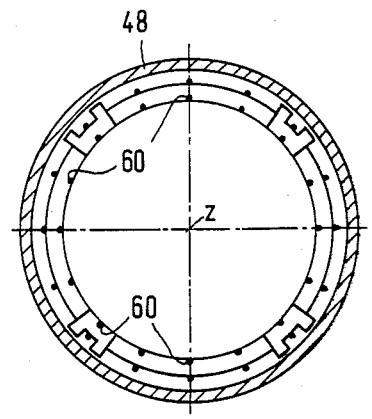

FIG. 2a is an axial sectional view of an integrated gradient r.f. coil system 4 and FIG. 2b is a radial sectional view thereof. Symmetrically with respect to the radial symmetry plane 30 there are arranged, for example combined X- and Y-gradient coil arc conductor stacks 40 and 42, two Z-gradient coil arc conductors 44 and current return arc conductors 46. For the invention it is irrelevant how many of such arc conductors stacks are included in the gradient coil system and how they are distributed and integrated. For example, a Z-gradient coil arc conductor stack can also be oriented in the Z-plane and, if desired, Z-gradient arc conductors which customarily form substantially complete rings can be integrated with X- and Y-gradient arc conductors which are azimuthally shifted through 90° with respect to one another and which extend through azimuthal arc angles of, for example from approximately 90° to approximately 180°. A tube 48, closed or not, provides axial interconnection of coil components of the gradient coil system. In the present embodiment, the tube 48 deliberately has a diameter which is larger than the outer diameter of, for example the arc conductor stacks 40 and 42 and the current return arc conductor stack 46 is mounted directly against the inside diameter of tube 48. As a result, the system can have a cylindrical shape within a central portion 50 having a diameter of, for example approximately 60 cm, terminating in conical ends 52 having a diameter which increases to, for example, approximately 75 cm as diagrammatically denoted by a stroke line 55, so that the described advantages are obtained. Intermediate pieces 54 and 56 for notably the X-Y coil arc conductor stacks 40 and 42 are made of an electrically insulating, non-magnetic material and preferably form closed rings. Axially directed conductors 60 of an r.f. coil, for example in the form of a bird-cage coil as disclosed in EP 213665, are included in the gradient coil system, for example by making these conductors extend through the intermediate pieces of the arc conductor stacks as shown in FIG. 2a. The conductors 60 may also be arranged along or in the tubes 48 or may be mounted, for example against an inner side 62 of the arc conductor stacks. Such a mounting results in a cylindrical coil system which comprises the gradient coils as well as an r.f. transmitter coil and which can be mounted in a magnetic resonance apparatus as one unit. Measured radially, a substantial saving in space is thus obtained, so that notably the energy required for the gradient coil system is substantially reduced. The r.f. field can be modulated in a positive sense by way of adapted positioning of arc conductors or turns of the gradient coil system. As a result, a higher homogeneity can be obtained for the r.f. field and axial propagation of the r.f. field can be strongly reduced, so that fewer stray-fields occur and a lower power supply energy suffices for the r.f. coil system. Due to the rotationally symmetrical construction around at least two mutually perpendicular axial planes, the r.f. coil can operate in the quadrature mode, without any geometrical modification of the coil system being required. Return arc conductors can be positioned and operated so that they exert a compensating effect for r.f. stray-fields. Amplification and power supply equipment can be substantially reduced by the invention, both as regards power and hence complexity and costs.

What is claimed is:

1. A magnetic resonance apparatus, comprising a magnet system for generating a steady magnetic field, a magnet system for generating mutually perpendicular field gradients, and an r.f. coil for generating a spatially uniform r.f. magnetic field, characterized in that the gradient coil system and the r.f. coil are combined so as to form a magnetically and structurally integrated gradient/r.f. coil system and in that current conductors of the gradient coil system and current conductors of the r.f. coil are situated in substantially the same cylinder generated surface.

2. A magnetic resonance apparatus as claimed in claim 1, characterized in that current conductors of a gradient coil system act as shielding members for the r.f. coil.

3. A magnetic resonance apparatus as claimed in claim 2, characterized in that the location of the current conductors of the gradient coil system and current conductors of the r.f. coil with respect to one another is adapted so as to obtain optimum spatial homogeneity of the r.f. magnetic field to be generated in a measuring space.

4. A magnetic resonance apparatus as claimed in claim 3, characterized in that, viewed axially, current conductors of the gradient coil system which are situated further outwards are located so as to obtain optimum shielding of an r.f. stray-field at that area.

5. A magnetic resonance apparatus as claimed in claim 1, characterized in that current conductors of the r.f. coil are accommodated in recesses in structural members of the gradient coil system.

6. A magnetic resonance apparatus as claimed in claim 1, characterized in that said current conductors of the gradient coil system are arc conductors and wherein arc conductors of the gradient coil system which are situated further outwards from a central symmetry plane have a diameter which is larger than that of more centrally situated arc conductors.

7. A magnetic resonance apparatus as claimed in claim 1, characterized in that the integrated coil system is symmetrically situated with respect to two mutually perpendicular axial planes in order to enable quadrature generation of the r.f. magnetic field.

8. A magnetic resonance apparatus, comprising a magnet system for generating mutually perpendicular field gradients, and an r.f. coil for generating a spatially uniform r.f. magnetic field, characterized in that the gradient coil system and the r.f. coil are combined so as to form a magnetically and structurally integrated gradient/r.f. coil system in that current conductors of the gradient coil system act as shielding members for the r.f. coil.

9. A magnetic resonance apparatus as claimed in claim 8, characterized in that the location of the current conductors of the gradient coil system and current conductors of the r.f. coil with respect to one another is adapted so as to obtain optimum spatial homogeneity of the r.f. magnetic field to be generated in a measuring space.

10. A magnetic resonance apparatus as claimed in claim 9, characterized in that, viewed axially, current conductors of the gradient coil system which are situated further outwards are located so as to obtain optimum shielding of an r.f. stray-field at that area.

11. A magnetic resonance apparatus as claimed in claim 8, characterized in that current conductors of the r.f. coil are accommodated in recesses in structural members of the gradient coil system.

12. A magnetic resonance apparatus as claimed in claim 8, characterized in that said current conductors of the gradient coil system are arc conductors and wherein arc conductors of the gradient coil system which are situated further outwards from a central symmetry plane have a diameter which is larger than that of more centrally situated arc conductors.

13. A magnetic resonance apparatus as claimed in claim 8, characterized in that the integrated coil system is symmetrically situated with respect to two mutually perpendicular axial planes in order to enable quadrature generation of the r.f. magnetic field.

14. A magnetic resonance apparatus, comprising a magnet system for generating mutually perpendicular field gradients, and an r.f. coil system for quadrature generating a circularly polarized r.f. magnetic field, characterized in that the gradient coil system and the r.f. coil system are combined so as to form a magnetically and structurally integrated gradient/r.f. coil system which is symmetrically situated with respect to two mutually perpendicular axial planes.

15. A magnetic resonance apparatus as claimed in claim 14, characterized in that current conductors of the gradient coil system act as shielding members for the r.f. coil.

16. A magnetic resonance apparatus as claimed in claim 14, characterized in that the location of current conductors of the gradient coil system and current conductors of the r.f. coil with respect to one another is adapted so as to obtain optimum spatial homogeneity of the r.f. magnetic field to be generated in a measuring space.

17. A magnetic resonance apparatus as claimed in claim 15, characterized in that, viewed axially, current conductors of the gradient coil system which are situated further outwards are located so as to obtain optimum shielding of an r.f. stray-field at that area.

18. A magnetic resonance apparatus as claimed in claim 14, characterized in that current conductors of the r.f. coil are accommodated in recesses in structural members of the gradient coil system.

19. A magnetic resonance apparatus as claimed in claim 14, characterized in that said current conductors of the gradient coil system are arc conductors and wherein arc conductors of the gradient coil system which are situated further outwards from a central symmetry plane have a diameter which is larger than that of more centrally situated arc conductors.

20. A magnetic resonance apparatus comprising a magnet system for generating a steady magnetic field along an axis, a magnet system for generating mutually perpendicular field gradients, and an r.f. coil for generating an r.f. magnetic field, characterized in that the gradient coil system and the r.f. coil are combined so as to form an integrated gradient/r.f. coil system including an axially directed supporting member having an inside diameter, said gradient coil system comprising a plurality of stacks of current conductors, which stacks are carried on the inside diameter of said supporting member, and said r.f. coil including r.f. current conductors which are supported by said stacks.

21. A magnetic resonance apparatus as claimed in claim 20, wherein said stacks of current conductors are radial stacks of arc conductors, and wherein the supported current conductors of said r.f. coil are axially directed radially between arc conductors of said stacks.

* * * * *